(12) United States Patent
Kobayashi et al.

(10) Patent No.: US 7,205,025 B2
(45) Date of Patent: Apr. 17, 2007

(54) APPARATUS AND METHOD FOR DRYING UNDER REDUCED PRESSURE, AND COATING FILM FORMING APPARATUS

(75) Inventors: Shinji Kobayashi, Kikuchi-gun (JP); Takahiro Kitano, Kikuchi-gun (JP); Shinichi Sugimoto, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 11/212,725

(22) Filed: Aug. 29, 2005

(65) Prior Publication Data

US 2006/0003105 A1    Jan. 5, 2006

Related U.S. Application Data

(62) Division of application No. 10/615,800, filed on Jul. 10, 2003, now Pat. No. 6,966,949.

(30) Foreign Application Priority Data

Jul. 12, 2002    (JP)    ............... 2002-204133

(51) Int. Cl.
*B05D 3/00* (2006.01)

(52) U.S. Cl. ............. 427/240; 427/350; 427/377; 427/379

(58) Field of Classification Search ............... 427/350, 427/240, 377, 379
See application file for complete search history.

(56) References Cited

U.S. PATENT DOCUMENTS

| 6,151,796 | A | 11/2000 | Karamatsu et al. |
| 6,190,459 | B1 | 2/2001 | Takeshita et al. |
| 6,222,161 | B1 | 4/2001 | Shirakawa et al. |
| 6,261,007 | B1 | 7/2001 | Takamori et al. |
| 6,364,953 | B1 | 4/2002 | Kawakami et al. |
| 6,443,641 | B2 | 9/2002 | Takamori et al. |
| 6,473,995 | B2 * | 11/2002 | Miyakawa et al. ........... 34/403 |

* cited by examiner

*Primary Examiner*—Kirsten Jolley
(74) *Attorney, Agent, or Firm*—Oblon, Spivak, McClelland, Maier & Neustadt, P.C.

(57) ABSTRACT

In drying a coating liquid such as a resist applied to a substrate under reduced pressure, a coating film in a peripheral portion tends to lose good shape regardless of duration of a drying period, and it is difficult to set an appropriate exhaust flow rate. After the substrate is loaded in an airtight container, a pressure is reduced from atmospheric pressure to a pressure slightly higher than the vapor pressure of a solvent, for example. Then, the solvent actively evaporates from the coating liquid. Here, evacuation is performed initially based on a first flow rate set value Q1, and thereafter, it is performed based on a second flow rate set value larger than Q1. Rounding of the surface in the peripheral portion is corrected by evacuation based on Q1, and more active evaporation of a solvent component is attained by switching to Q2.

3 Claims, 11 Drawing Sheets

APPARATUS AND METHOD FOR DRYING UNDER REDUCED PRESSURE, AND COATING FILM FORMING APPARATUS

CROSS-REFERENCE TO RELATED APPLICATIONS:

This application is a divisional application of, and claims priority to, U.S. patent application Ser. No. 10/615,800 filed Jul. 10, 2003 now U.S. Pat. No. 6,966,949 and claims priority to Japanese Patent Application Serial Number 2002-204133 filed Jul. 12, 2002.

BACKGROUND OF THE INVENTION

1. Field of the Invention

The present invention relates to an apparatus for drying under reduced pressure which dries a substrate having a coating liquid such as a resist applied on its surface in a pressure-reduced atmosphere, a coating film forming apparatus employing the apparatus for reducing pressure, and a method of drying under reduced pressure.

2. Description of the Background Art

A spin coating method with which a resist liquid is applied while a substrate is rotated is commonly used for forming a resist film used in photolithography. Recently, a method of applying the resist liquid with a nozzle in such a manner as one stroke writing has been developed. As a resist liquid used in such an applying method, a solvent with low volatility, such as high-boiling thinner, is usually employed as a solvent dissolving a resist component. In this case, in order to dry the resist liquid in a short time after it is applied, drying under reduced pressure is advantageous.

To that end, the applicant considers a unit for drying under reduced pressure shown in FIG. 10, for example. The unit for drying under reduced pressure includes a sealed container 1 constituted of a cover 10 and a mount portion 11. In a ceiling of cover 10, an exhaust hole 12 is provided. Exhaust hole 12 is connected to a vacuum pump 14 with a pipe 15 through a pressure regulating valve which is a pressure regulating portion, whereby pressure reduction down to a prescribed pressure is attained in sealed container 1. In addition, a straightening vane 16 capable of up and down movement is provided so that a component evaporated from the coating liquid forms a uniform exhaust stream on the surface of a wafer W.

In such a unit for drying under reduced pressure, wafer W having the resist liquid applied is mounted on mount portion 11, and straightening vane 16 is set to a position at a prescribed height so as to face wafer W. Then, a temperature of wafer W is adjusted by not-shown temperature adjustment means provided in mount portion 11, and vacuum pump 14 is actuated for pressure reduction and evacuation. Here, as shown in a section A of a pressure curve in FIG. 11, the pressure in sealed container 1 rapidly lowers. Thereafter, when the pressure reaches as low as the vapor pressure of the solvent, the solvent starts to evaporate, and the pressure gently lowers around the vapor pressure, as shown with a section B. When most of the solvent evaporates, the pressure again rapidly lowers, as shown in a section C. When the prescribed pressure is attained, vacuum pump 14 is stopped, and a treatment of drying under reduced pressure is completed. The pressure curve exhibits considerable variation, depending on a type of the solvent, an amount of the applied resist liquid, concentration of the resist component in the resist liquid, a temperature in drying, or a flow rate of the exhaust.

Meanwhile, a coating liquid film R on the surface of wafer W before drying exhibits a rounded corner shape due to surface tension of the coating liquid itself in a peripheral region of wafer W (an area extending inward from the periphery by approximately 20 mm, for example), as shown in FIG. 12A, for example. Accordingly, straightening vane 16 for correcting the rounding is provided so as to face the surface of wafer W. In other words, straightening vane 16 is positioned such that the solvent component that evaporates from coating liquid film R flows outward through a gap between straightening vane 16 and the surface of wafer W. When a current spreads coating liquid film R in an outward direction, the liquid is moved toward the outer periphery, thereby attaining evenness.

On the other hand, in the method of drying under reduced pressure as described above, an important parameter for correction is a time period for drying (time period of section B). When the exhaust flow rate during pressure reduction and evacuation is increased, the solvent actively evaporates, and the time period of section B is shortened. On the other hand, the solvent evaporates before the shape of coating liquid film R is corrected. In other words, drying is completed with the rounded shape in the peripheral portion still remaining, as shown in FIG. 12B. As a result, in an area extending inward from the periphery by approximately 30 mm, the film thickness decreases toward the outward direction, and the film exhibits such a shape that it sharply rises in a portion considerably close to the periphery. In contrast, if the exhaust flow rate is set smaller and the time period of section B is extended, a point attaining high in-plane uniformity in terms of thickness of the coating liquid film is overreached, and an area approximately 5 mm inside the periphery may be raised as shown in FIG. 12C, resulting in lower throughput.

With regard to pressure control within sealed container 1, the pressure change in section B is nominal, for example, 26.6 Pa (0.2 Torr). Therefore, it is difficult to control the pressure within sealed container 1 by operating valve lift of pressure regulating valve 13. Consequently, pressure regulating valve 13 is in a full open state while the solvent is actively evaporating. Therefore, the exhaust flow rate is determined by capability of vacuum pump 14, and adjustment of the drying time period (adjustment of the time period of section B) is achieved by selecting a type of the solvent. As a result, it has been difficult to adjust (condition) a parameter for drying under reduced pressure, and to obtain a coating film with high in-plane uniformity in terms of film thickness.

SUMMARY OF THE INVENTION

The present invention was made based on aforementioned circumstances. An object of the present invention is to provide an apparatus and method for drying under reduced pressure, attaining easy adjustment of a drying time period as well as excellent in-plane uniformity in terms of film thickness, when obtaining a coating film by subjecting a coating liquid applied to a substrate to drying under reduced pressure. Another object of the present invention is to provide a coating film forming apparatus attaining excellent in-plane uniformity in terms of film thickness by incorporating the apparatus for drying under reduced pressure.

An apparatus for drying under reduced pressure according to the present invention dries a solvent in a coating liquid by placing a substrate having the coating liquid applied in a pressure-reduced atmosphere. The apparatus for drying under reduced pressure includes an airtight container in which a substrate mount portion for mounting the substrate is provided to place the substrate in the pressure-reduced atmosphere; a straightening vane provided so as to face a surface of the substrate mounted on the substrate mount portion with a gap interposed, and having a size the same as or larger than an effective area of the substrate; means for evacuating and reducing pressure in the airtight container; an exhaust flow rate regulating portion for regulating a flow rate of an exhaust for pressure reduction; and a control portion outputting a flow rate set value for the exhaust flow rate regulating portion, and varying the flow rate set value at least in two steps while the solvent is actively evaporating from the coating liquid.

Here, the phrase "while the solvent is actively evaporating from the coating liquid" refers to a state in which, when the pressure is reduced in the airtight container, evacuation by the means for evacuating and reducing pressure and evaporation of the solvent are balanced, to attain the vapor pressure of the solvent or a pressure close thereto, that is, a pressure slightly higher than that attaining the boiling point of the solvent, for example. With regard to the size of the straightening vane, the effective area of the substrate refers to an area where the coating film on the substrate is made use of, that is, an area where a semiconductor device is formed on a semiconductor wafer or a liquid crystal display glass substrate, for example.

A manner in which the control portion varies the flow rate set value at least in two steps includes varying from one to the other among a first flow rate set value and a second flow rate set value larger than the first flow rate set value. In this case, a timing for switching between the first flow rate set value and the second flow rate set value is a timing attaining evenness in a peripheral portion of the coating film better than in a case where evacuation has been continued based on the first flow rate set value or in a case where evacuation has been continued based on the second flow rate set value while the solvent is actively evaporating from the coating liquid. In the present invention, the control portion can be configured so as to include a timer forming a timing of switching between the first flow rate set value and the second flow rate set value. In addition, the apparatus for drying under reduced pressure further includes a pressure detecting portion for detecting a pressure in the airtight container, and the control portion may switch the flow rate set value between the first flow rate set value and the second flow rate set value based on a pressure value detected by the pressure detecting portion. In addition, the control portion may be configured to store data corresponding to a pattern of the flow rate set value while the solvent is actively evaporating from the coating liquid, for each type of the coating liquid, for each film thickness of the coating liquid, or for each combination of the type and the film thickness of the coating liquid.

According to the apparatus for drying under reduced pressure of the present invention, following effects can be obtained. A cross-sectional shape of the peripheral portion of the coating film varies, depending on the drying time period, and evenness in the cross-sectional shape is deteriorated if the drying time period is too long or too short. On the other hand, if the flow rate set value is varied at least in two steps while the solvent component in the coating liquid is actively evaporating, a stage in which the solvent evaporates with high speed can be combined with a stage in which the solvent evaporates with low speed. Therefore, a pattern of exhaust flow rate attaining evenness of the coating film in the peripheral portion of the substrate can readily be set.

Another invention provides an apparatus for forming a coating film on a substrate. The coating film forming apparatus includes a cassette mount portion in which a cassette storing a plurality of substrates is loaded; a coating unit applying a coating liquid to the substrate; the apparatus for drying under reduced pressure as described above, into which the substrate having the coating liquid applied in the coating unit is loaded; and means for taking out the substrate from the cassette mounted on the cassette mount portion, carrying the substrate into the coating unit, and carrying the substrate having the coating liquid applied to the apparatus for drying under reduced pressure.

Yet another invention provides a method of drying under reduced pressure for drying a solvent in a coating liquid by placing a substrate having the coating liquid applied in a pressure-reduced atmosphere. The method includes the steps of mounting the substrate on a substrate mount portion provided in an airtight container; positioning a straightening vane so as to face a surface of the substrate mounted on the substrate mount portion with a gap interposed; evacuating and reducing pressure in the airtight container down to a pressure at which a solvent component actively evaporates from the coating liquid; and varying a flow rate set value at least in two steps while the solvent component is actively evaporating from the coating liquid.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
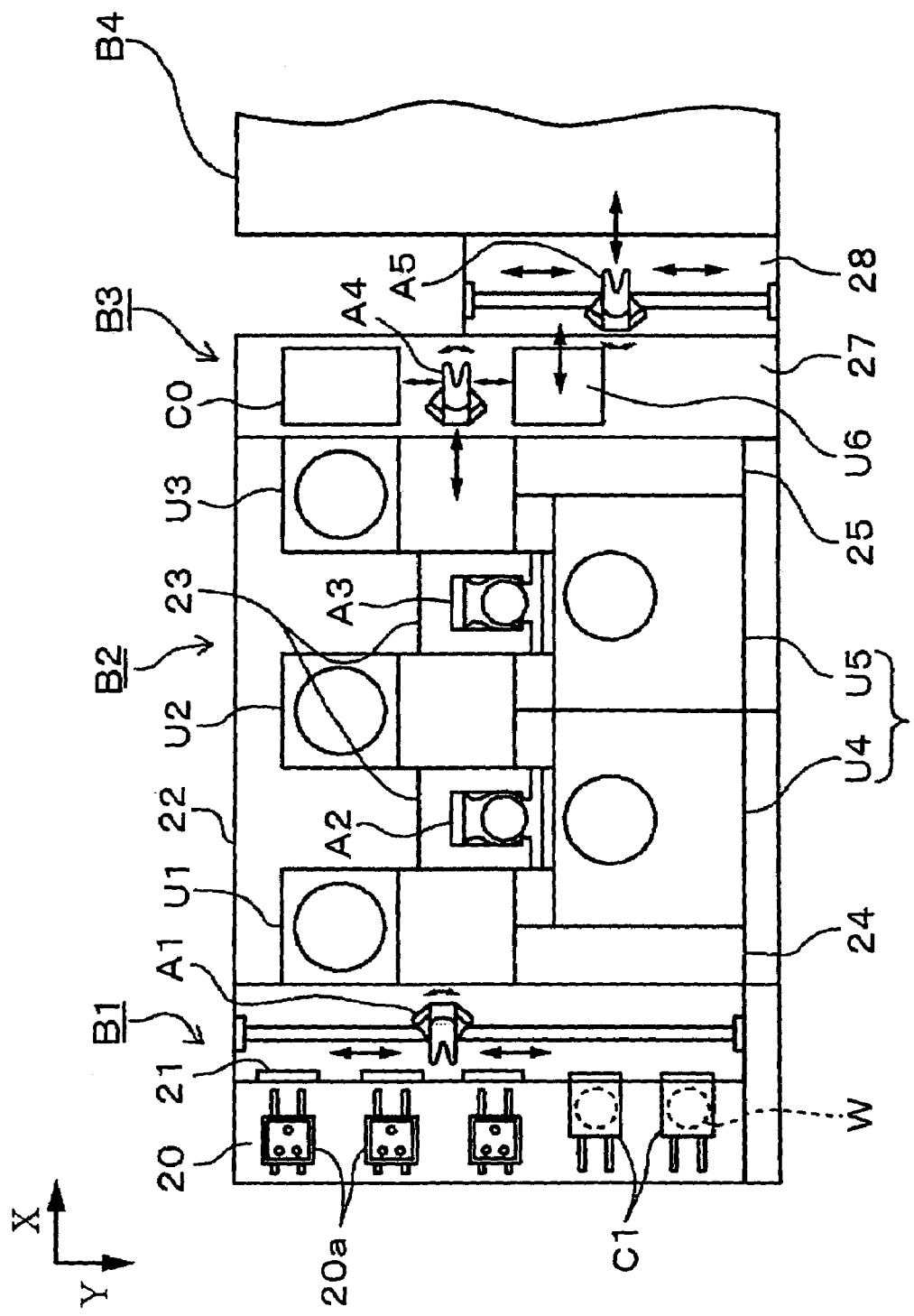
FIG. 1 is a plan view showing one example of a coating and development apparatus incorporating an apparatus for drying under reduced pressure according to the present invention.
Figure 2:
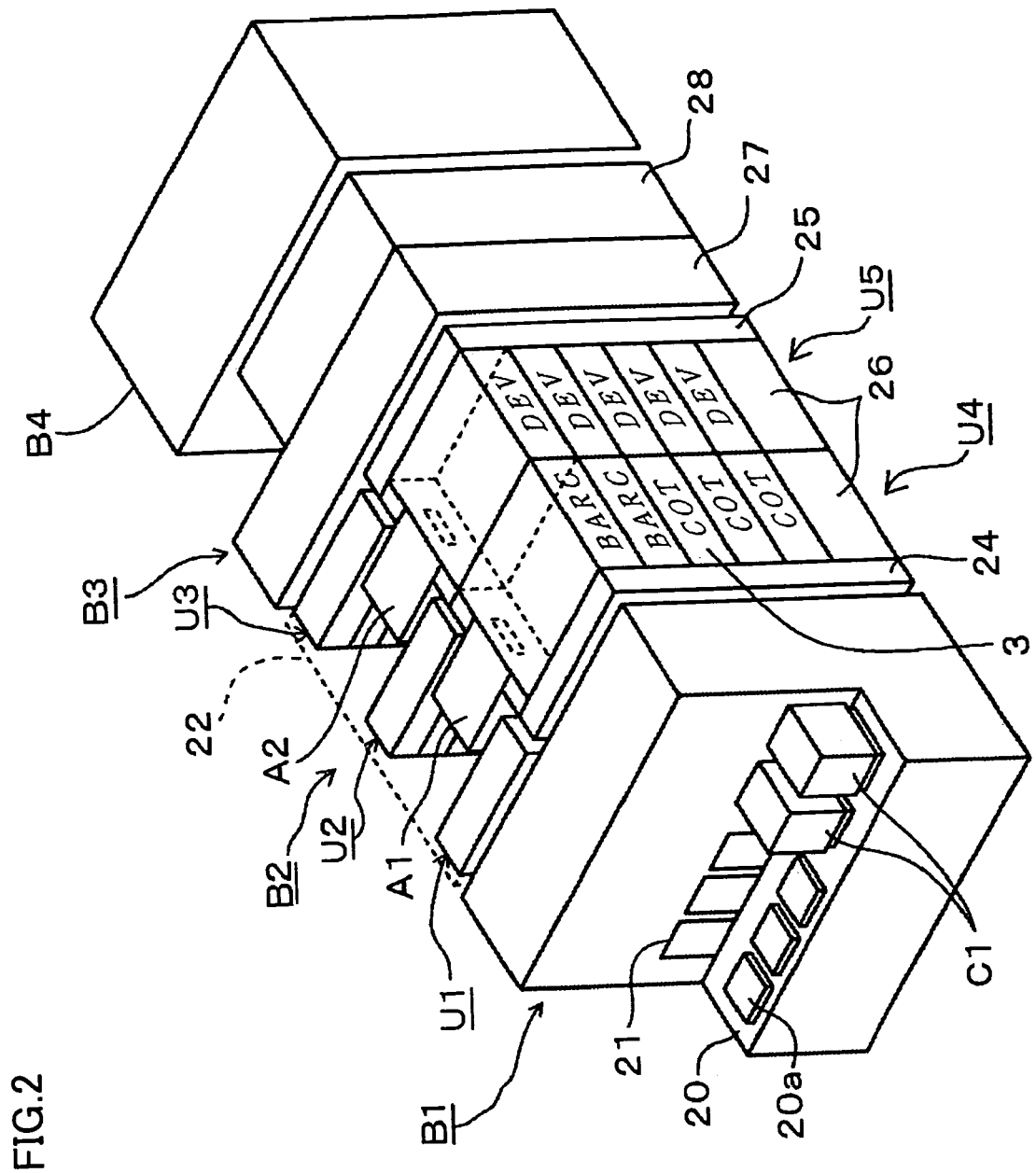
FIG. 2 is a perspective view showing one example of the coating and development apparatus incorporating the apparatus for drying under reduced pressure according to the present invention.

Prior to describing an apparatus for drying under reduced pressure according to the present invention, brief description of a configuration of an exemplary coating/development apparatus serving as a coating film forming apparatus incorporating the apparatus for drying under reduced pressure according to the present invention will be provided, with reference to FIGS. 1 and 2. In the drawings, reference character B1 represents a cassette mount portion for loading/unloading a cassette C storing, in a sealed manner, 13 wafers W serving as substrates, for example. The cassette mount portion includes a cassette station with a mount portion 20a on which a plurality of cassettes C can be mounted; an open/close portion 21 provided on a wall surface facing cassette station 20; and delivery means A1 for taking out wafer W from cassette C through open/close portion 21.

A treatment portion B2 surrounded by a housing 22 is connected to the back of cassette mount portion B1. In treatment portion B2, shelf units U1, U2, U3 implemented by providing heating/cooling units in a multistage manner therein, and main carrier means A2, A3 for delivering wafer W among each treatment unit including a coating/development unit described later are alternately arranged sequentially from the front side. In other words, shelf units U1, U2, U3 and main carrier means A2, A3 are arranged in one line in front-to-rear direction when viewed from cassette mount portion B1. In addition, a not-shown opening for wafer delivery is formed in each connecting portion, so that wafer W can freely move from shelf unit U1 on one end to shelf unit U3 on the other end within treatment portion B1. Main carrier means A2, A3 are placed in a space surrounded by a partition wall 23, which is formed by one plane on shelf unit U1, U2, U3 arranged in front-to-rear direction when viewed from cassette mount portion B1, one plane on a liquid treatment unit U4, U5 described later on the right-hand side, for example, and a back face serving as one face on the left-hand side. Reference characters 24 and 25 represent temperature and humidity adjustment units equipped with an apparatus for adjusting a temperature of a treatment liquid used in each unit, or a duct for adjusting temperature and humidity.

Liquid treatment units U4, U5 are configured such that a coating unit (COT) 3, a development unit DEV, an antireflection coating forming unit BARC and the like are piled to form multiple stacks, for example, 5 stacks, on a storage portion 26 providing a space for supplying liquids such as a coating liquid (resist liquid) or a developer, as shown in FIG. 2, for example. Shelf units U1, U2, U3 already described are configured such that a variety of units for performing pre-treatment and post-treatment for a treatment performed in liquid treatment units U4, U5 are piled to form multiple stacks, for example, 10 stacks. A combination therein includes an apparatus for drying under reduced pressure for drying wafer W having a coating liquid applied on the surface in coating unit 3 in a pressure-reduced atmosphere to evaporate a solvent contained in the coating liquid, a heating unit for heating (baking) wafer W, a cooling unit for cooling wafer W, and the like.

An exposure portion B4 is connected to the back of shelf unit U3 in treatment portion B2 through an interface portion B3 constituted of a first carrier room 27 and a second carrier room 28, for example. In interface portion B3, in addition to two delivery means A4, A5 for delivering wafer W between treatment portion B2 and exposure portion B4, a shelf unit U6 and a buffer cassette C0 are provided.

In the following, one exemplary flow of a wafer in this apparatus will be described. Initially, when cassette C storing wafer W is mounted on a mount base 20, a cover of cassette C is removed along with opening of open/close portion 21, and wafer W is taken out by delivery means AR1. Then, wafer W is delivered to main carrier means A2 through a not-shown delivery unit forming one stage of shelf unit U1, and subjected to antireflection coating forming treatment and cooling treatment, for example, as pre-treatment of coating treatment in one shelf within shelf units U1–U3. Thereafter, the resist liquid is applied to wafer W in coating unit 3. Next, when a resist film is formed on the surface of wafer W through drying under reduced pressure by the apparatus for drying under reduced pressure of the present invention, wafer W is subjected to heating (baking treatment) in the heating unit forming one shelf in shelf units U1–U3, followed by cooling. Thereafter, wafer W goes through the delivery unit in shelf unit U3, and loaded into interface portion B3. In interface portion B3, wafer W is carried via a path from delivery means A4, shelf unit U6, delivery means A5, for example, as far as exposure portion B4, in which wafer W is subjected to exposure. After exposure, wafer W is carried to main carrier means A2 via the path in reverse order, and developed in development unit DEV, thereby forming a resist mask. Thereafter, wafer W is returned to its cassette C on mount base 20.

Figure 3:
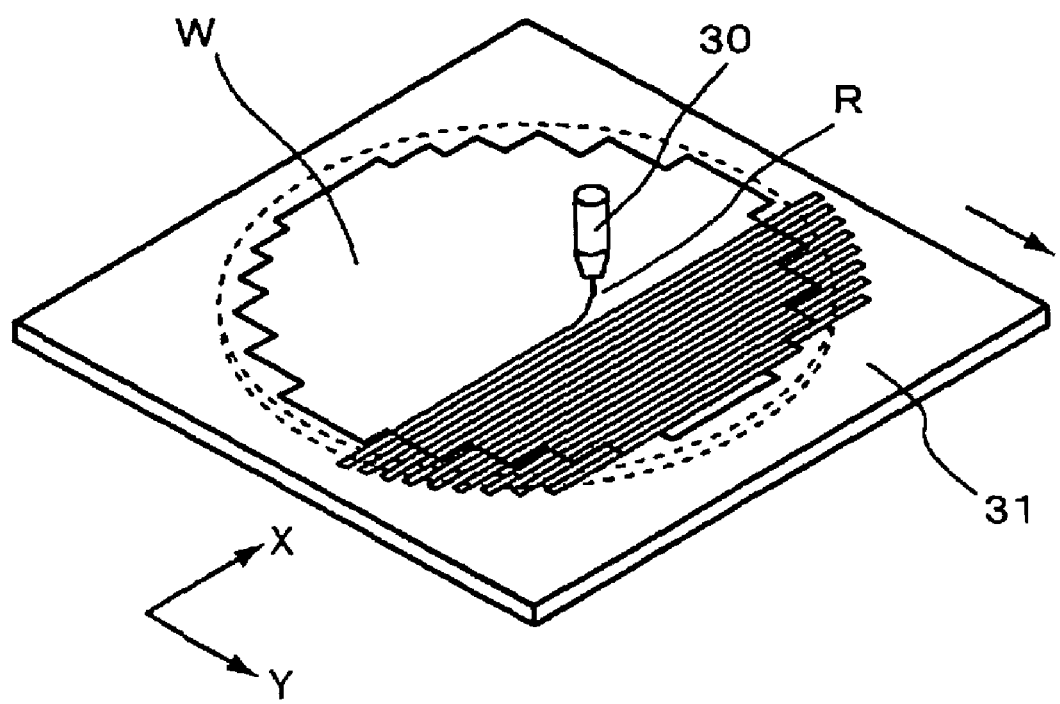
FIG. 3 illustrates how a coating liquid film to be subjected to a treatment of drying under reduced pressure is formed.

A method for applying coating liquid (resist liquid) R obtained by mixing a resist component and a solvent, for example, to the surface of wafer W in coating unit 3 described above located in a previous stage of the apparatus for drying under reduced pressure according to the present invention will briefly be described, with reference to FIG. 3. In a space for treating a substrate in the coating unit, a supply nozzle 30 of coating liquid R placed so as to face the surface of wafer W held horizontally by a not-shown substrate holding portion is moved back and forth in one direction (a direction designated with X in the drawing), to supply the coating liquid onto wafer W. In such a case, a plate 31 is provided so as not to supply coating liquid R outside an expected coating area. When supply nozzle 30 moves from one end face to the other end face of the substrate, at this timing, wafer W is intermittently conveyed to a direction intersecting that movement by a not-shown conveyor mechanism. By repeating such an operation, coating liquid R is applied to wafer W in such a manner as what is called "one stroke writing".

An embodiment of the apparatus for drying under reduced pressure according to the present invention will now be described with reference to FIG. 4. The apparatus for drying under reduced pressure includes an airtight container 40, in which a mount base 4 serving as a substrate mount portion for mounting wafer W having the coating liquid applied is provided. A cooling portion consisting of a temperature adjustment portion 41 for adjusting a temperature of mounted wafer W, such as a Peltier device, is embedded in mount base 4, and mount base 4 and temperature adjustment portion 41 are combined to constitute a temperature adjusting plate. Specifically, a projection 42 for holding a substrate is provided in a position corresponding to a periphery on the back face of wafer W, so that wafer W is placed above mount base 4 with a small gap interposed, for example, approximately 0.1 mm above the surface of mount base 4. In addition, a substrate support pin 43 passing through mount base 4 in a vertical direction is provided in a manner retractable by an elevating mechanism 44a and a base body 44, so as to support the back face of wafer W from below and to elevate/lower wafer W in loading/unloading the same.

Therefore, wafer W is mounted on mount base 4 by cooperation of substrate support pin 43 and carrier arm MA described above.

A cover 5 is provided above mount base 4, and its free movement upward and downward is allowed by a not-shown cover elevating/lowering mechanism. Cover 5 is elevated when wafer W is loaded/unloaded, while it is lowered in drying under reduced pressure, so as to implement airtight container 40 along with mount base 4. An exhaust hole 51 is provided in the vicinity of the center of the ceiling. Exhaust hole 51 is connected to a vacuum pump 53 as vacuum evacuation means via an exhaust path 52 formed by an exhaust pipe, for example. In exhaust path 52, a pressure detecting portion 54, a flow rate detecting portion 55, a flow rate regulating portion 56 such as a flow rate regulating valve, and a main valve 57 are provided sequentially from the side of airtight container 40.

Figure 4:
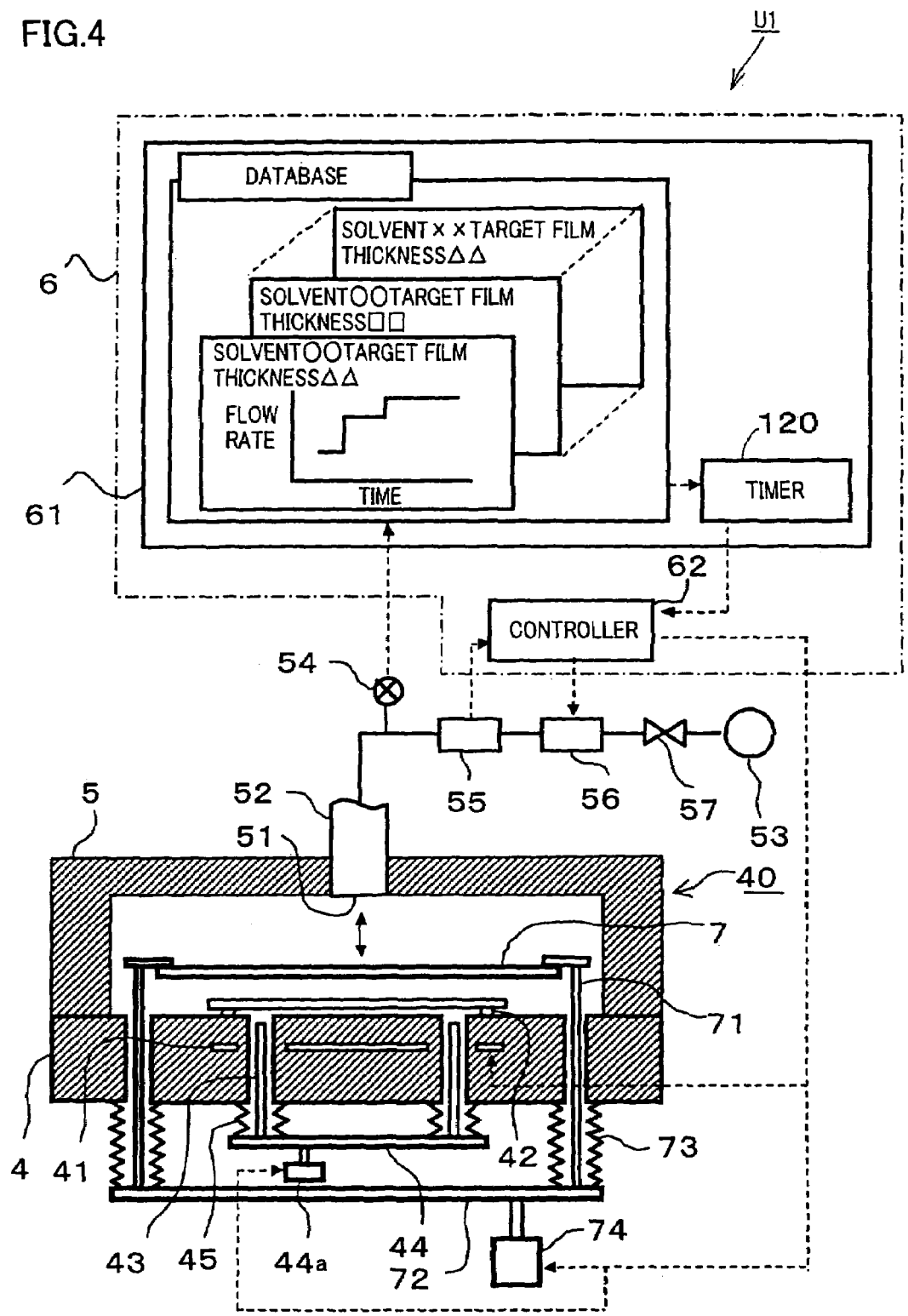
FIG. 4 is a longitudinal cross-sectional view showing an apparatus for drying under reduced pressure according to an embodiment of the present invention.

FIG. 4 shows a control system for controlling the exhaust flow rate. In the drawing, reference character 61 represents a controller, which outputs a control signal for flow rate regulating portion 56 such as a valve lift signal, by performing a prescribed operation based on a flow rate set value output from a computer 62 also serving as a set value output portion, and a flow rate value detected by flow rate detecting portion 55.

Computer 62 stores a set value for an exhaust flow rate, for example, for each type and film thickness of the resist liquid. In this example, when the type of the resist liquid is determined, the type of the solvent and concentration of the resist component are determined. In addition, when the film thickness of the resist liquid is determined, an amount of the solvent is accordingly determined. Therefore, the set value for the exhaust flow rate attaining an excellent in-plane uniformity in terms of thickness of the resist film is determined in accordance with the type and the amount of the solvent.

Figure 6A:
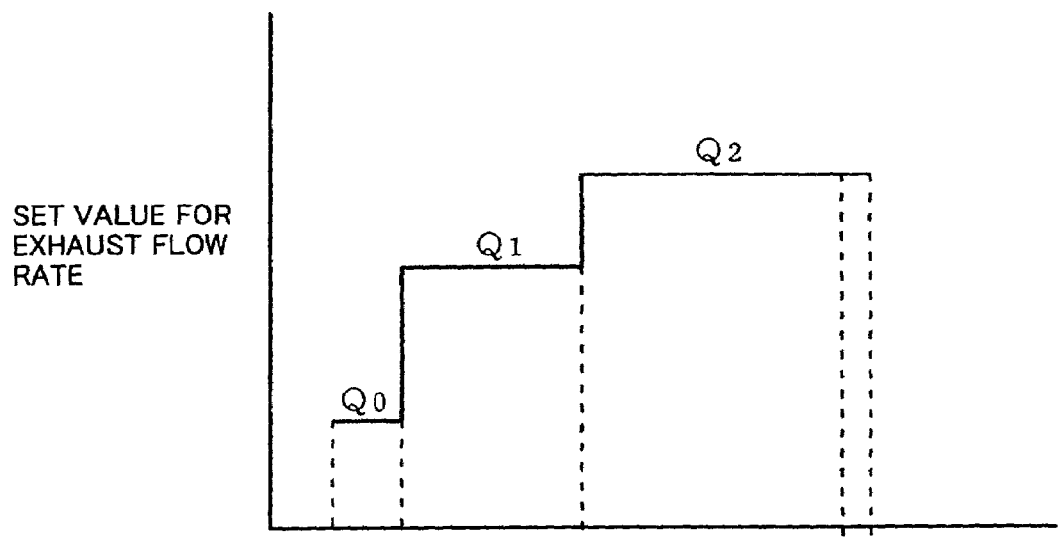
FIGS. 6A to 6D illustrate one example of a set value for exhaust flow rate and a state of pressure in the apparatus for drying under reduced pressure.

The set value for the exhaust flow rate is stored as chronological data of the set value with respect to time, as shown in FIG. 6A described later, for example. The set value for the exhaust flow rate is determined in the following manner. From a time point when atmospheric pressure is attained in airtight container 40 until a time point when the solvent in the resist liquid film starts to actively evaporate, a set value Q0 is output. During a period in which the solvent in the resist liquid film is actively evaporating, a first set value Q1 attaining low exhaust flow rate is initially output, and then, a second set value Q2 larger than Q1 and attaining high exhaust flow rate is output, though described in detail later. Switching from Q0 to Q1 is performed based on the pressure value detected by pressure detecting portion 54, for example, whereas switching from Q1 to Q2 is performed after a pre-set time has elapsed since the output of Q1, for example (a time point when the detected pressure value attains a pressure P1 shown in FIG. 6B). In this example, control portion 6 is constituted of computer 62 and controller 61.

A straightening vane 7 having a size equal to or larger than the effective area of wafer W is provided above mount base 4, so as to face the surface of wafer W. The effective area of wafer W refers to an area in which the coating film on wafer W is made use of In this case, it refers to an area where a semiconductor device is formed. In the present example, straightening vane 7 is formed in a circular shape, slightly larger in size than wafer W. Straightening vane 7 is supported by support members 71, for example, at three points on its periphery. Support members 71 passing through mount base 4 are configured so as to allow height adjustment by an elevating mechanism 74 and an elevation base 72. Reference characters 45 and 73 represent bellows for maintaining a pressure-reduced state within airtight container 40 via a through hole for substrate support pin 43 and support member 71. Control portion 6 attains a function to control an operation of elevating mechanisms 44a, 74 and temperature adjustment portion 41.

Figure 5:
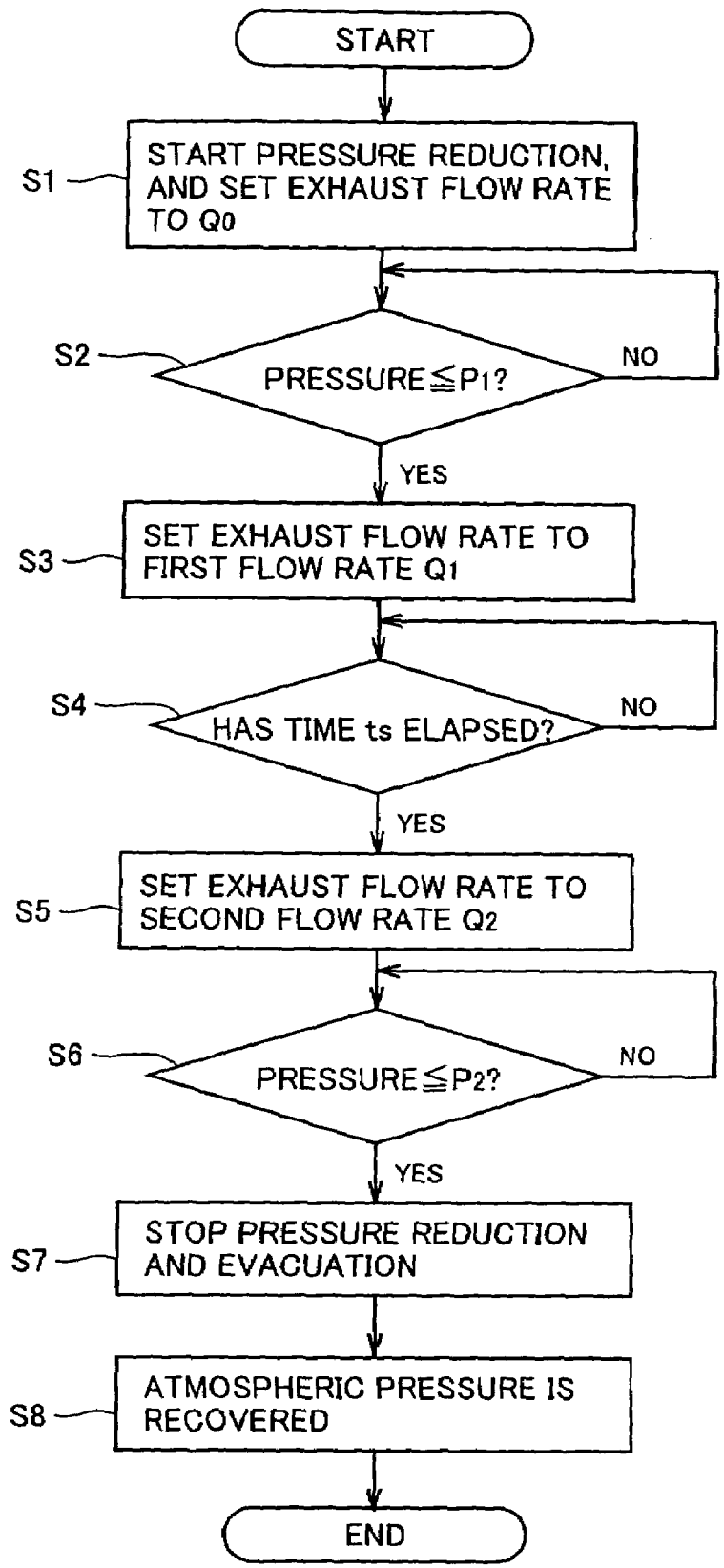
FIG. 5 is a flowchart illustrating process steps in drying under reduced pressure in the apparatus for drying under reduced pressure.
Figure 6B:
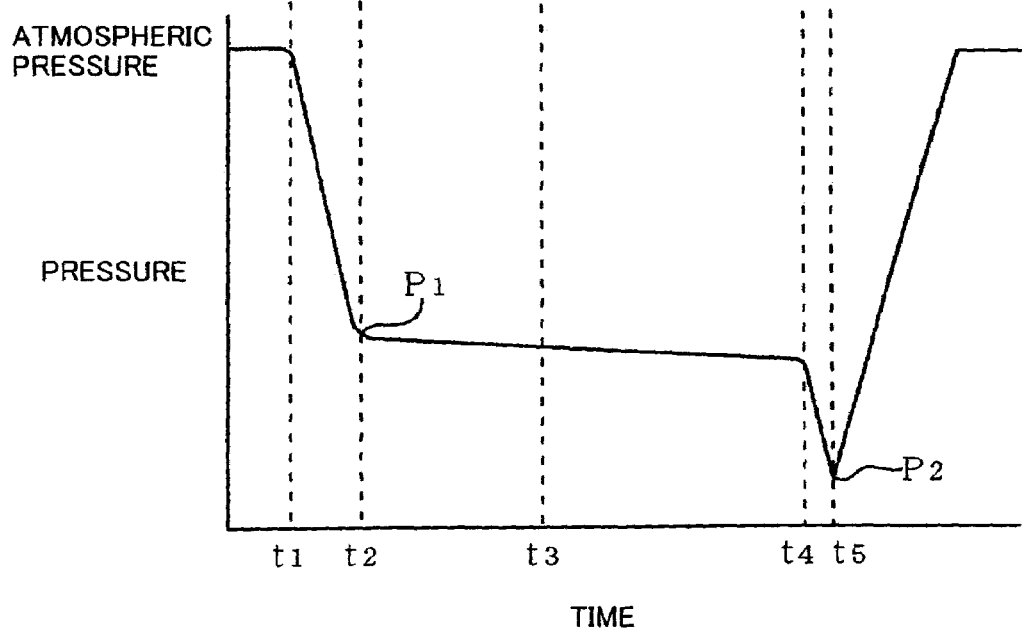

In the following, an effect of the present invention will be described with reference to FIGS. 5, 6A and 6B. FIG. 5 is a flowchart showing a flow in a treatment of drying under reduced pressure, while FIGS. 6A and 6B illustrate the set value for the exhaust flow rate and the pressure within airtight container 40. First, in a state where cover 5 is elevated, wafer W, for example, with 8-inch size, is loaded by carrier arm MA, and is mounted on mount base 4 by cooperation with substrate support pin 4. The resist liquid, which is a coating liquid dissolving the resist component in the solvent, is applied to the wafer to a liquid thickness of approximately 0.03 mm, for example, with a coating method shown in FIG. 3.

Then, cover 5 is lowered to implement airtight container 40 surrounding wafer W. In succession, straightening vane 7 is lowered, so that the lower face thereof is set to a position 1 to 5 mm above the surface of wafer W, for example. Here, wafer W is set to a prescribed temperature, for example, 18° C. by temperature adjustment portion 41. At time t1, main valve 57 opens to start pressure reduction and evacuation (step S1). On the other hand, based on selection of a process recipe by an operator, for example, computer 62 selects a pattern of the set value for the exhaust flow rate corresponding to the recipe. When the process recipe is selected, the type and film thickness of the resist liquid applied in coating unit 3 are determined, and therefore, the corresponding set value for the exhaust flow rate is determined.

In this example, the set value for the exhaust flow rate output from computer 62 attains to Q0, for example, 100 liters/minute. The valve lift of flow rate regulating portion 55 is regulated based on set value Q0, and the pressure in airtight container 40 is rapidly lowered as shown in FIG. 6B. Computer 62 monitors the pressure in airtight container 40, based on the detected pressure value from pressure detecting portion 54, and determines whether or not the pressure attains to not larger than P1 (step S2). Pressure P1 is a pressure slightly higher than the vapor pressure of the solvent in the coating liquid, for example, that is, a pressure attaining a state slightly before the solvent boils. Hence, the solvent starts to actively evaporate. Though the pressure in airtight container 40 may be reduced as low as to the vapor pressure of the solvent determined by the temperature of wafer W so as to attain a boiling state, a state slightly before boiling is preferred in order to avoid roughness of the resist film. The value for pressure at which the solvent actively evaporates is around 1.33 kPa (1 Torr), for example. The process for reducing pressure from the atmospheric pressure to pressure P1 may be performed by pressure control.

Figure 7:
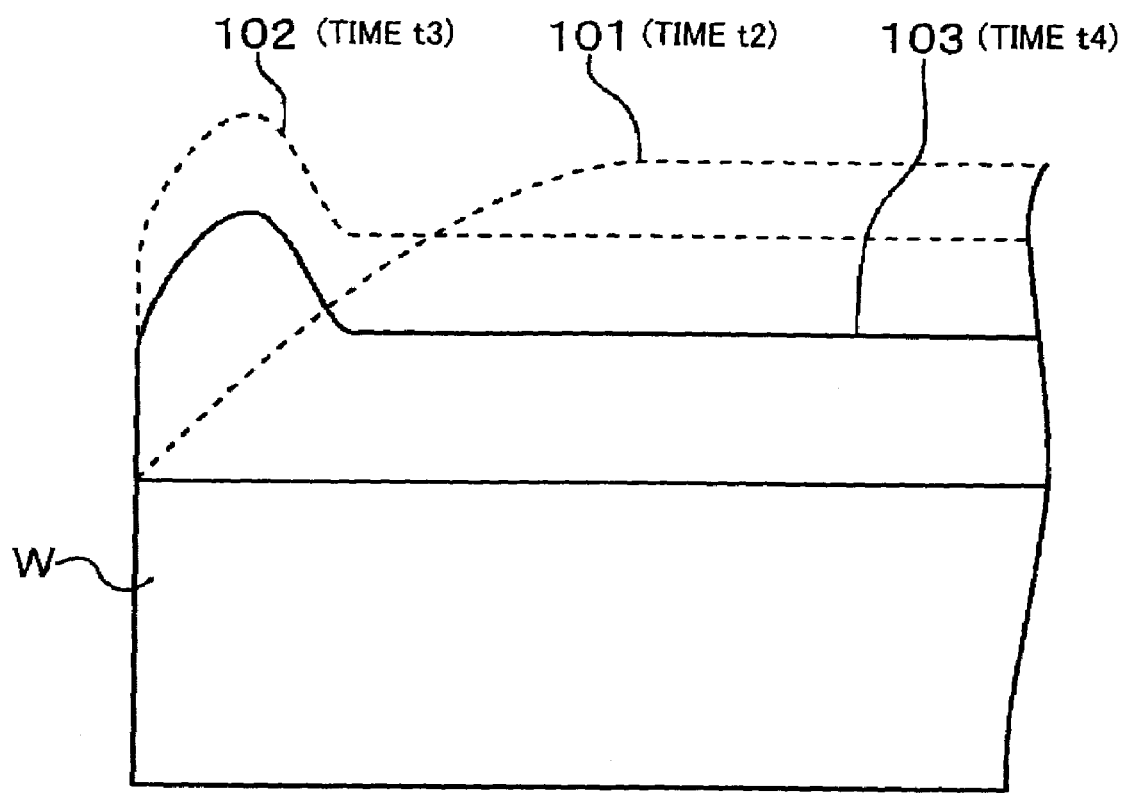
FIG. 7 illustrates one example of a shape of a coating film that has been subjected to drying under reduced pressure in the apparatus for drying under reduced pressure.
Figure 12A:
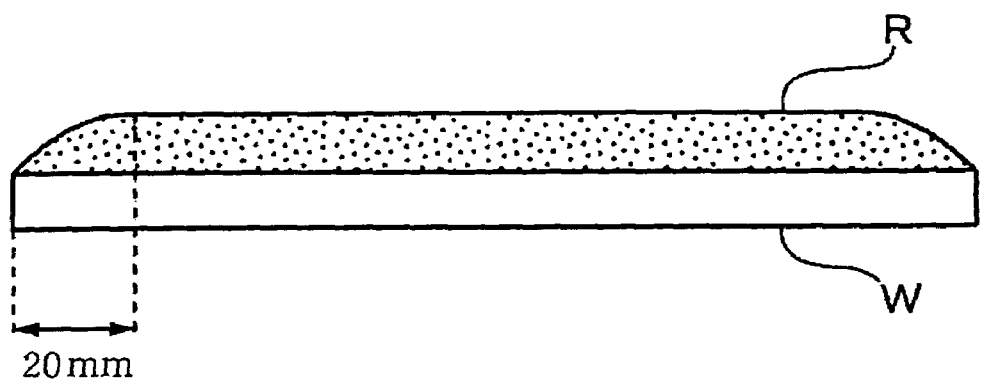
FIGS. 12A to 12C illustrate shapes of the coating liquid on the surface of a substrate.

When the pressure detected by pressure detecting portion 54 attains to not larger than P1 (time t2), computer 62 changes the set value for the exhaust flow rate from Q0 to first set value Q1 (step S3). When first set value Q1 is set, the exhaust flow rate is set to 200 liters/minute, which is a low exhaust flow rate. The solvent actively evaporates from the surface of wafer W, and the vapor of the solvent flows outward through a small gap between the surface of wafer W and straightening vane 7. FIG. 7 schematically illustrates the surface shape of the peripheral portion, when the solvent evaporates from the liquid film of the resist liquid on wafer W to leave the resist component, thereby forming the resist film. At time t2, as described already with reference to FIG. 12A, an area extending inward approximately 30 mm from the periphery of wafer W exhibits a rounded shape due to the surface tension, as shown with reference character 101. As the vapor of the solvent flows in an outward direction, the solvent flows toward the periphery on the surface of wafer W, and the peripheral portion is gradually raised. When evacuation is continued with low exhaust flow rate, the area extending inward from the periphery by approximately 5 mm will be raised, as shown in FIG. 12C described previously. Then, as shown with reference character 101 in FIG. 7, the exhaust flow rate is increased at a time point when a liquid level in the peripheral portion has risen to some extent. The timing for this switching is controlled in terms of time, for example. In other words, a timer 120 provided in computer 61 is started at a time point when the pressure attains to not larger than P1, and whether or not a pre-set time ts has elapsed (step S4) is determined. At time t3 after time ts has elapsed, as shown in FIGS. 6A and 6B, the flow rate set value is switched to second set value Q2, and evacuation is performed with a high exhaust flow rate, for example, 500 liters/minute (step S5).

The pressure and temperature "while the solvent is actively evaporating" considerably differ, depending on the solvent. When cyclohexanone is used as the solvent, "the solvent actively evaporates" at 15° C. (temperature of a cooling plate) and at a pressure of 266 Pa (2.0 Torr).

Figure 6C:
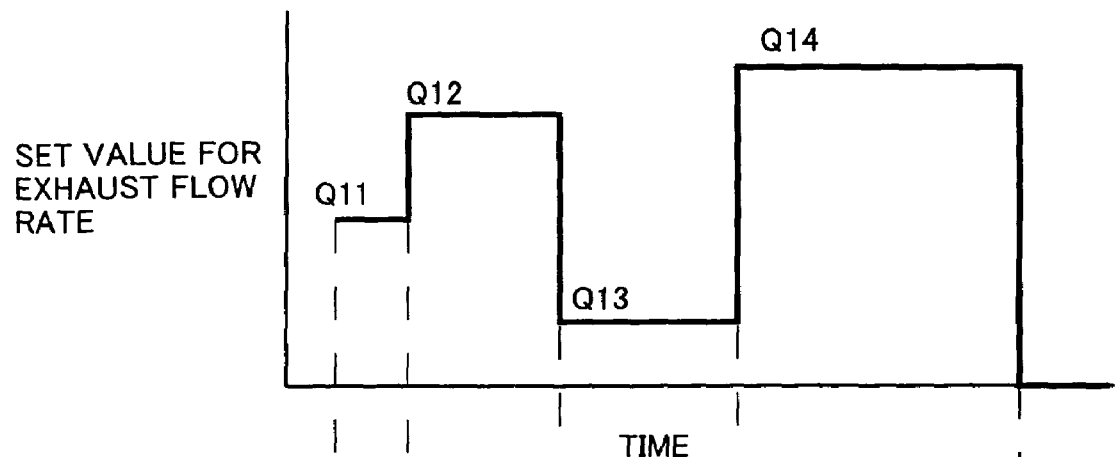
Figure 6D:
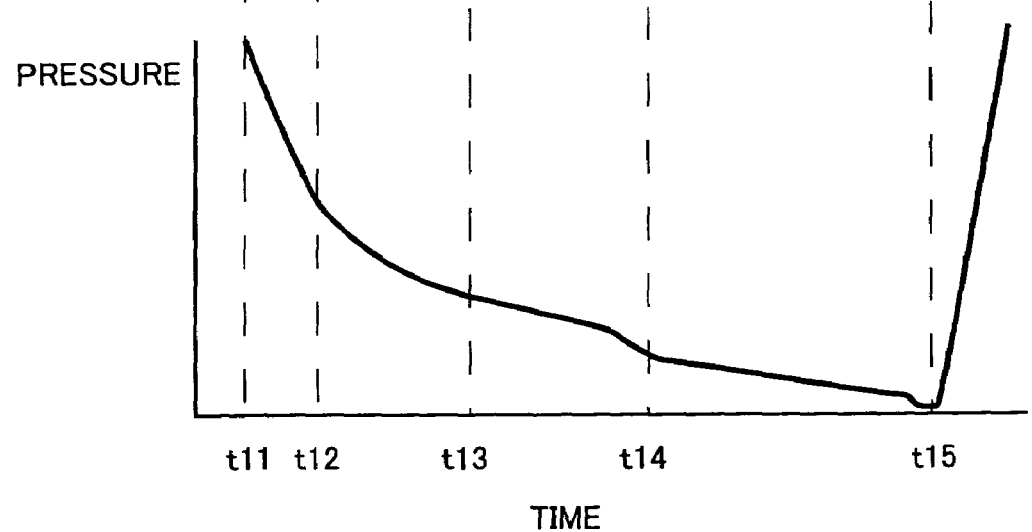

When the solvent is composed of a plurality of thinners, the pressure at which each thinner volatilizes is different. For example, the solvent composed of a thinner with low vapor pressure (such as NMP: N-methylpyrrolidinone and GBL: γ-butyrolactone) volatilizes very slowly, resulting in the extended drying time period. If the drying time period is extended, profile tends to exhibit irregularity. In order to complete drying in a shorter period of time, the exhaust flow rate is increased. FIG. 6C is a graph showing the set value for the exhaust flow rate for the solvent composed of a plurality of thinners, while FIG. 6D is a graph showing the pressure of the solvent composed of a plurality of thinners. When the solvent is composed of a plurality of thinners, the pressure is not constant, as shown in FIG. 6D. Therefore, it is necessary to set a variety of set values Q11 to Q14 for the exhaust flow rate, as shown in FIG. 6C. In each example, the set value for the exhaust flow rate can be changed to a variety of values. Magnitude relation among set values Q0 to Q14 for the exhaust flow rate can be set in a variety of ways.

Figure 12B:
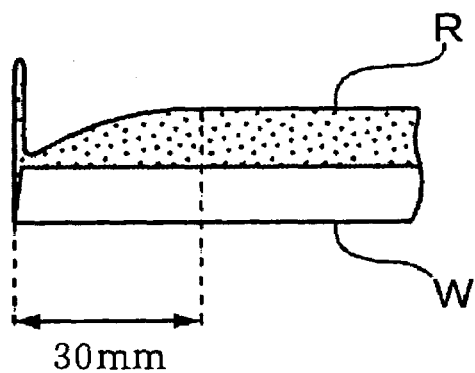
Figure 12C:
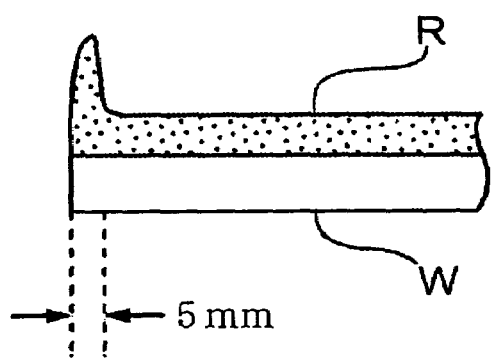

In an example where an amount of the solvent is large, if evacuation is continued with a high exhaust flow rate, the peripheral portion exhibits a rounded shape, and the area in the vicinity of the periphery rises sharply, as shown in FIG. 12B described previously. On the other hand, as an amount of the solvent has already been reduced by evacuation with low exhaust flow rate, fluidity of the liquid is small. Therefore, the solvent evaporates and dries, substantially maintaining a surface shape indicated by dotted line 102, as shown with reference character 103 in FIG. 7.

At time t4, most of the solvent has evaporated. After that time point, the vapor of the solvent and the air remaining in airtight container 40 are evacuated, and the pressure starts to rapidly decrease. During this pressure decrease as well, a small amount of the solvent remaining in the resist film evaporates. After computer 62 outputs second set value Q2 as the set value for the exhaust flow rate, it monitors the detected pressure value, and determines whether or not the pressure attains to not larger than P2 (step S6). When the pressure attains to not larger than P2, main valve 57 is closed to stop pressure reduction and evacuation (step S7). Then, a purging gas, for example, an inert gas such as nitrogen, is supplied by not-shown gas supply means, to recover the atmospheric pressure in airtight container 40 (step S8). Here, pressure P2 is of a magnitude comparative to that when the solvent in the resist film has completely evaporated. After the pressure in airtight container 40 returns to the atmospheric pressure, cover 5 is opened and wafer W is unloaded from mount base 4.

In the example above, the timing to switch the set value for the exhaust flow rate from Q0 to Q1 is set to a time point when the detected pressure value has attained a pressure comparative to pressure P1. The timing, however, may be set to a time point when a pre-set time has elapsed since when the pressure reduction and evacuation started. In addition, after the pressure in airtight container 40 is reduced to pressure P1, the pressure gradually decreases, though by a small amount, while the solvent actively evaporates. Therefore, the timing to switch the set value for the exhaust flow rate from first flow rate set value Q1 to second flow rate set value Q2 may be set based on the detected pressure value. The timing to switch from Q1 to Q2 can be set by finding a timing at which high in-plane uniformity in terms of film thickness can be obtained, through experiments for each type of the resist liquid (the type of the solvent, and concentration of the resist component, for example) and for each film thickness of the coating liquid.

Determination of a time point when the resist film almost completely has dried may be administered based on time instead of the detected pressure value. For example, the determination may be made by recognizing that a pre-set time period has elapsed since a time point when pressure reduction and evacuation started or since when the pressure attained to P1.

According to the embodiments described above, while the solvent component in the coating liquid is actively evaporating and the coating liquid film containing the solvent has fluidity, evacuation is performed with a low exhaust flow rate, whereby the shape of the coating liquid film (rounding of the peripheral portion due to surface tension) can be corrected. Then, when evacuation is performed with a high exhaust flow rate, the solvent component evaporates further actively. Here, however, the solvent has already evaporated to some extent, and fluidity of the coating liquid film has been lowered. Therefore, the remaining solvent can evaporate in a short period of time, maintaining the corrected shape of the coating liquid film or a state close to that shape.

The present embodiment and an example in which the exhaust flow rate is kept constant will be compared for description. In order to obtain a resist film of a certain target film thickness, for example, under a condition where the exhaust flow rate is constant, it is assumed that an appropriate drying time period with respect to thickness of the resist liquid has been found. If a resist liquid of a double thickness is formed in order to double a target film thickness of the resist film, a double amount of coating liquid should be applied on the surface of wafer W. In this case, the drying time period is simply doubled, the time for correction is extended, and the peripheral portion exhibits a raised shape. When the exhaust flow rate is increased, the surface of the wafer is dried before correction, although the drying time period is shortened. On the other hand, in the present embodiment, a resist film attaining in-plane uniformity can be formed on the surface of wafer W by combining flow rate settings of high and low exhaust flow rates. In addition, the present embodiment can attain the treatment of drying under reduced pressure for the resist liquid in a short time, for example, in the drying time period approximately 1.3 times of that corresponding to original target film thickness, thereby completing drying under reduced pressure in a short time.

Figure 8:
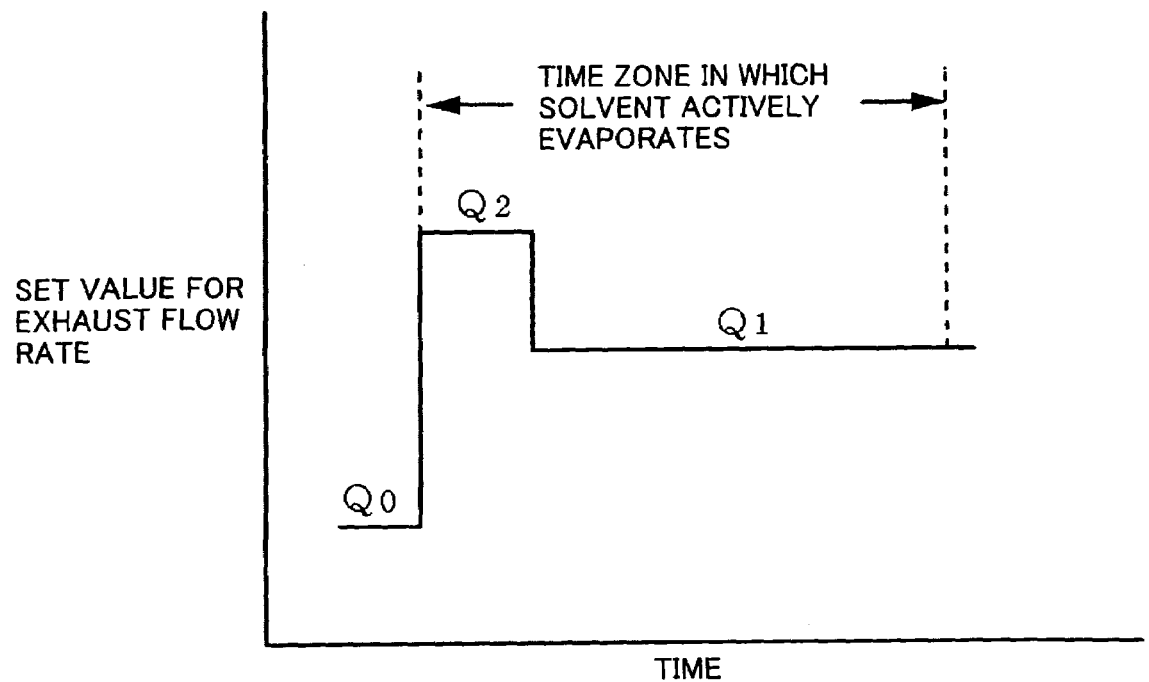
FIG. 8 illustrates another example of the flow rate set value in the apparatus for drying under reduced pressure.
Figure 9:
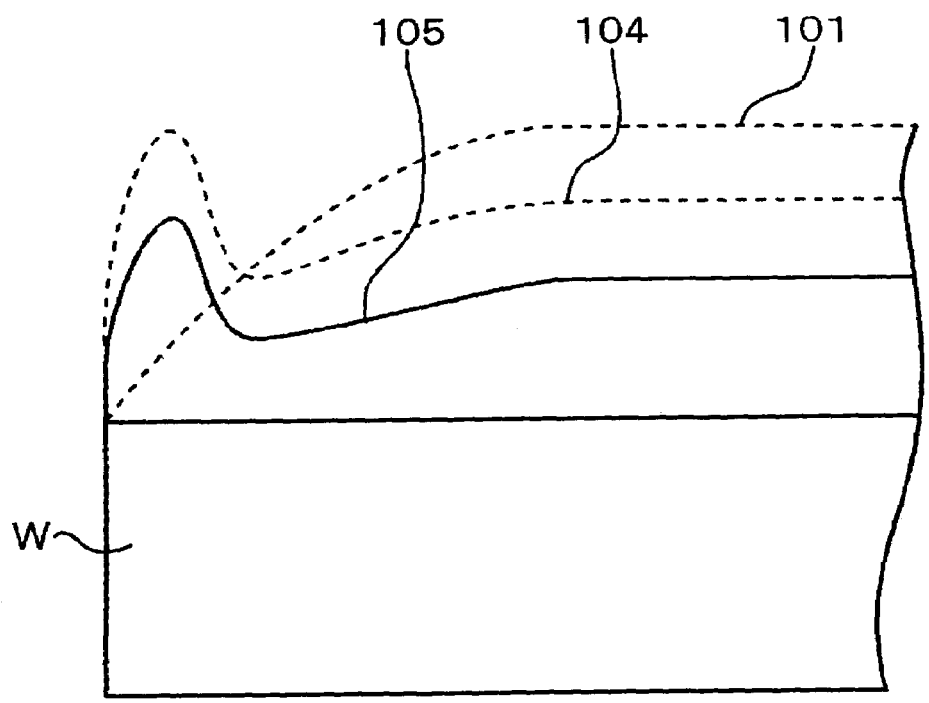
FIG. 9 illustrates another example of a shape of the coating film that has been subjected to drying under reduced pressure in the apparatus for drying under reduced pressure.
Figure 10:
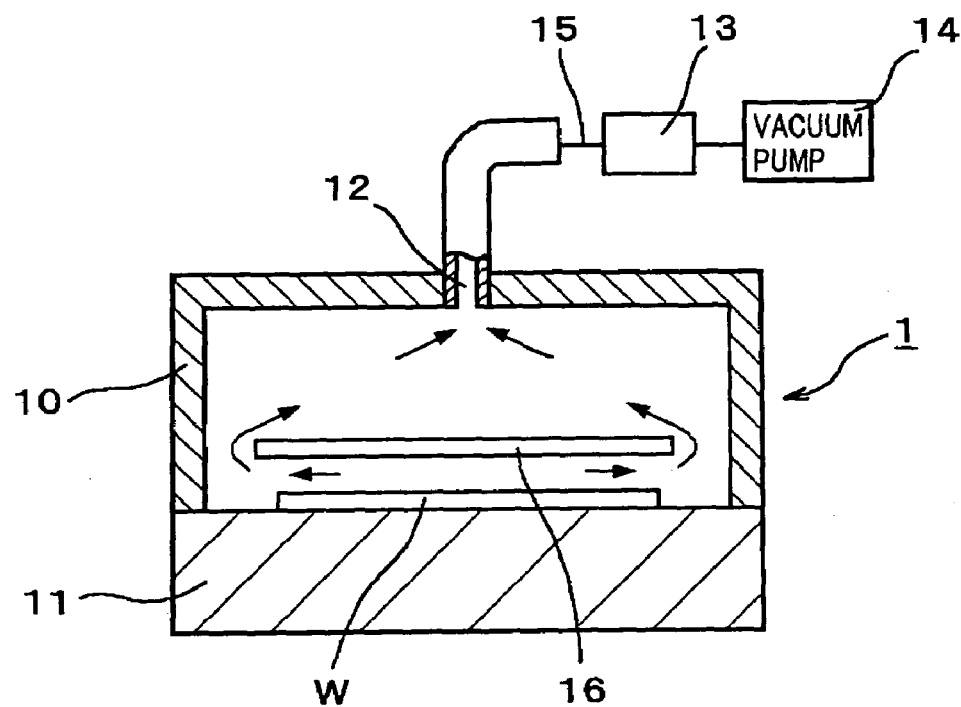
FIG. 10 is a longitudinal cross-sectional view showing a conventional apparatus for drying under reduced pressure.
Figure 11:
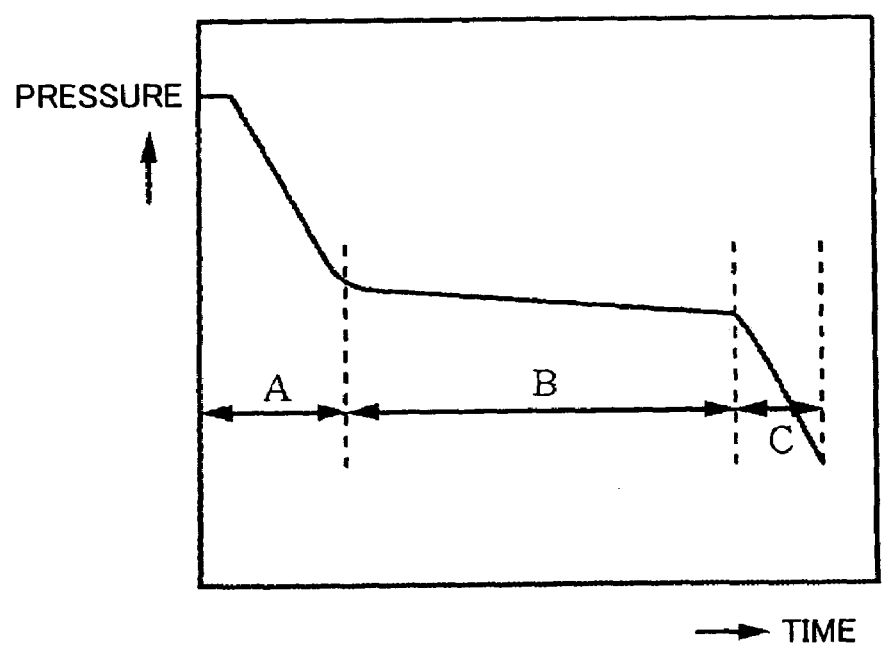
FIG. 11 illustrates a state of pressure in drying under reduced pressure in the conventional apparatus for drying under reduced pressure.

The present invention is not limited to a configuration in which the exhaust flow rate is varied from low exhaust flow rate to high exhaust flow rate, and it may be varied from high exhaust flow to low exhaust flow rate. FIG. 8 shows one example of the set value for the exhaust flow rate at a time point when the pressure in airtight container 40 has attained to not larger than pressure P1. In this case, as shown with reference character 101 in FIG. 9, initially, the periphery of wafer W exhibits rounded shape due to surface tension. When evacuation is performed with high exhaust flow rate, the solvent flows toward the periphery with high speed on the surface of wafer W. Though the peripheral portion once exhibits a depressed shape as approaching the periphery, it tends to rise thereafter, as shown with reference character 104 in FIG. 9. If evacuation is continued with high exhaust flow rate, a shape shown in FIG. 12B will appear as described previously. By switching to low exhaust flow rate, however, the solvent evaporates and dries, substantially maintaining the surface shape shown with dotted line 104, as shown with reference character 105 in FIG. 9. In an example in which an amount of the solvent is large, if evacuation is continued with a low exhaust flow rate, the peripheral portion exhibits a rounded shape as shown in FIG. 12C described previously. Here, however, fluidity of the liquid is small, because the evacuation has already been performed with a high exhaust flow rate, and the amount of the solvent has already been reduced. Therefore, the solvent is dried, maintaining the corrected shape or a state close to that shape.

In the present invention as described above, either one of low exhaust flow rate or high exhaust flow rate may be set prior to the other. As shown in FIGS. 6A and 6B, however, it is more advantageous to set low exhaust flow rate first and set high exhaust flow rate thereafter. This is because the surface shape can be corrected while there is large amount of liquid and sufficient fluidity, and because the timing to switch the exhaust flow rate can readily be found. In the present invention, the flow rate set value should only be varied at least in two steps. In other words, three flow rate set values different from one another may be prepared, and the flow rate set value may be varied in three steps. Alternatively, instead of switching the set value in steps, the set value may gradually be increased or decreased. Further, the present invention is applicable to the treatment of drying under reduced pressure for a substrate other than the semiconductor wafer, such as an LCD substrate and a reticle substrate for photomask.

The cross-sectional shape of the peripheral portion of the coating film is varied, depending on the drying time period. If the drying time period is too long or too short, evenness of the cross-sectional shape is deteriorated. In the present invention, however, a stage in which the solvent evaporates fast and a stage in which the solvent evaporates slowly are combined while the solvent component in the coating liquid is actively evaporating, thereby correcting the cross-sectional shape of the coating film in the peripheral portion of the substrate. Therefore, a pattern for the exhaust flow rate attaining evenness of the coating film can readily be set. Thus, the coating film with excellent in-plane uniformity can be formed on the surface of the substrate.

An apparatus for drying under reduced pressure according to the present invention is constituted of shelf unit U1, for example. The apparatus for drying under reduced pressure dries a solvent in a coating liquid by placing wafer (W) as a substrate having a coating liquid applied in a pressure-reduced atmosphere. The apparatus for drying under reduced pressure includes airtight container 40, straightening vane 7, vacuum pump 53 as means for pressure reduction and evacuation, flow rate regulating portion 56 as a exhaust flow rate regulating portion, and control portion 6. In airtight container 40, mount base 4 as a substrate mount portion for mounting wafer W is provided. Airtight container 40 places wafer W in the pressure-reduced atmosphere. Straightening vane 7 is provided so as to face a surface of wafer W mounted on mount base 4 with a gap interposed, and has a size the same as or larger than an effective area of wafer W. Vacuum pump 53 performs evacuation and pressure reduction of airtight container 40. Flow rate regulating portion 56 regulates the exhaust flow rate for pressure reduction. Control portion 6 outputs a flow rate set value for flow rate regulating portion 56, and varies the flow rate set value at least in two steps while the solvent is actively evaporating from the coating liquid. Control portion 6 varies the flow rate set value from one to the other among first flow rate set value Q1 and second flow rate set value Q2 larger than the first flow rate set value, while the solvent is actively evaporating from the coating liquid. A timing for switching between first flow rate set value Q1 and second flow rate set value Q2 is a timing attaining evenness in a peripheral portion of the coating film better than in a case where evacuation has been continued based on first flow rate set value Q1 or in a case where evacuation has been continued based on second flow rate set value Q2 while the solvent is actively evaporating from the coating liquid. Control portion 6 includes timer 120 forming a timing of switching between first flow rate set value Q1 and second flow rate set value Q2. The apparatus for drying under reduced pressure further includes pressure detecting portion 54 for detecting a pressure in airtight container 40. Control portion 6 switches the flow rate set value between first flow rate set value Q1 and second flow rate set value Q2 based on a pressure value detected by pressure detecting portion 54.

Control portion 6 stores data corresponding to a pattern of the flow rate set value while the solvent is actively evaporating from the coating liquid, for each type of the coating liquid. Control portion 6 stores data corresponding to a pattern of the flow rate set value while the solvent is actively evaporating from the coating liquid, for each film thickness of the coating liquid.

Control portion 6 stores data corresponding to a pattern of the flow rate set value while the solvent is actively evaporating from the coating liquid, for each combination of the type and the film thickness of the coating liquid.

While the solvent is actively evaporating from the coating liquid, the pressure in airtight container 40 is set so as to be slightly higher than a pressure at which the solvent at room temperature attains to a boiling point in airtight container 40 in which pressure has been reduced.

A coating film forming apparatus according to the present invention includes cassette mount portion B1 in which a cassette storing wafers W as a plurality of substrates is loaded, coating unit 3 applying a coating liquid to wafer W, shelf unit U1 constituting the apparatus for drying under reduced pressure described above, into which wafer W having the coating liquid applied in coating unit 3 is loaded, and means A1 to A3 for taking out wafer W from the cassette mounted on cassette mount portion B1, carrying wafer W to coating unit 3, and carrying wafer W having the coating liquid applied to the apparatus for drying under reduced pressure.

In a method of drying under reduced pressure according to the present invention, the solvent in the coating liquid is dried by placing wafer W having the coating liquid applied in a pressure-reduced atmosphere. The method of drying under reduced pressure includes the steps of: mounting wafer W on mount base 4 provided in airtight container 40; positioning straightening vane 7 so as to face the surface of wafer W mounted on mount base 4 with a gap interposed; evacuating and reducing pressure in airtight container 40 down to a pressure at which a solvent component actively evaporates from the coating liquid; and varying a flow rate set value at least in two steps while the solvent component is actively evaporating from the coating liquid.

The step of varying the flow rate set value at least in two steps while the solvent component is actively evaporating from the coating liquid is the step of varying the flow rate set value from one to the other among first flow rate set value Q1 and second flow rate set value Q2 larger than first flow rate set value Q1. A timing for switching between first flow rate set value Q1 and second flow rate set value Q2 is a timing attaining evenness in a peripheral portion of the coating film better than in a case where evacuation has been continued based on the first flow rate set value or in a case where evacuation has been continued based on second flow rate set value Q2 while the solvent is actively evaporating from the coating liquid.

The step of reducing pressure down to a pressure at which the solvent component actively evaporates from the coating liquid includes the step of reducing pressure until the pressure in airtight container 40 is set so as to be slightly higher than a pressure at which the solvent at room temperature attains to a boiling point in airtight container 40 in which pressure has been reduced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for drying under reduced pressure with which a solvent in a coating liquid is dried by placing a substrate having the coating liquid applied in a pressure-reduced atmosphere, comprising the steps of:

mounting the substrate on a substrate mount portion provided in an airtight container;

positioning a straightening vane so as to face a surface of the substrate mounted on the substrate mount portion with a gap interposed;

evacuating and reducing pressure in the airtight container down to a pressure at which a solvent component actively evaporates from said coating liquid; and varying a flow rate set value at least in two steps while the solvent component is actively evaporating from said coating liquid; wherein the varying the flow rate set value at least in two steps includes varying the flow rate set value from a first flow rate set value to a second flow rate set value larger than the first flow rate set value.

2. The method for drying under reduced pressure according to claim 1, wherein a timing for switching between the first flow rate set value and the second flow rate set value is a timing attaining evenness in a peripheral portion of the coating film better than in a case where evacuation has been continued based on the first flow rate set value or in a case where evacuation has been continued based on the second flow rate set value while the solvent is actively evaporating from said coating liquid.

3. The method for drying under reduced pressure according to claim 1, wherein said step of reducing pressure down to a pressure at which the solvent component actively evaporates from said coating liquid includes the step of reducing pressure until the pressure in said airtight container is set so as to be slightly higher than a pressure at which the solvent at room temperature attains to a boiling point in said airtight container in which pressure has been reduced.

* * * * *